United States Patent [19]

Schmoock

[11] 4,063,116

[45] Dec. 13, 1977

[54] TEMPERATURE COMPENSATED CURRENT SOURCE

[75] Inventor: James C. Schmoock, San Jose, Calif.

[73] Assignee: Raytheon Company, Lexington, Mass.

[21] Appl. No.: 717,975

[22] Filed: Aug. 26, 1976

[51] Int. Cl.² .......................................... H03K 17/00
[52] U.S. Cl. .................................. 307/254; 307/255; 307/270; 307/310; 307/315
[58] Field of Search .............. 307/310, 315, 254, 255, 307/270, 297

[56] References Cited

U.S. PATENT DOCUMENTS

| | | | |
|---|---|---|---|
| 3,469,111 | 9/1969 | Peters et al. | 307/315 |
| 3,714,527 | 1/1973 | Schmidt | 307/310 |
| 3,757,137 | 9/1973 | Ahmed | 307/315 |

Primary Examiner—Stanley D. Miller, Jr.
Assistant Examiner—B. P. Davies
Attorney, Agent, or Firm—Richard M. Sharkansky; Joseph D. Pannone

[57] ABSTRACT

A temperature compensated, switchable current source wherein a Darlington pair of transistors in the output section of such current source is coupled to a source of switching signals through two electrical paths, each having a switching transistor and a diode network. The diode networks are arranged to produce a voltage variation at the input to the Darlington pair which varies inversely to the temperature variation developed across the base-emitter junctions of the Darlington pair of transistors. Coupling the Darlington pair of transistors to the source of switching signals through two switching transistors enables the current source to be rapidly driven from a conducting state to a nonconducting state in response to the switching signals.

24 Claims, 2 Drawing Figures

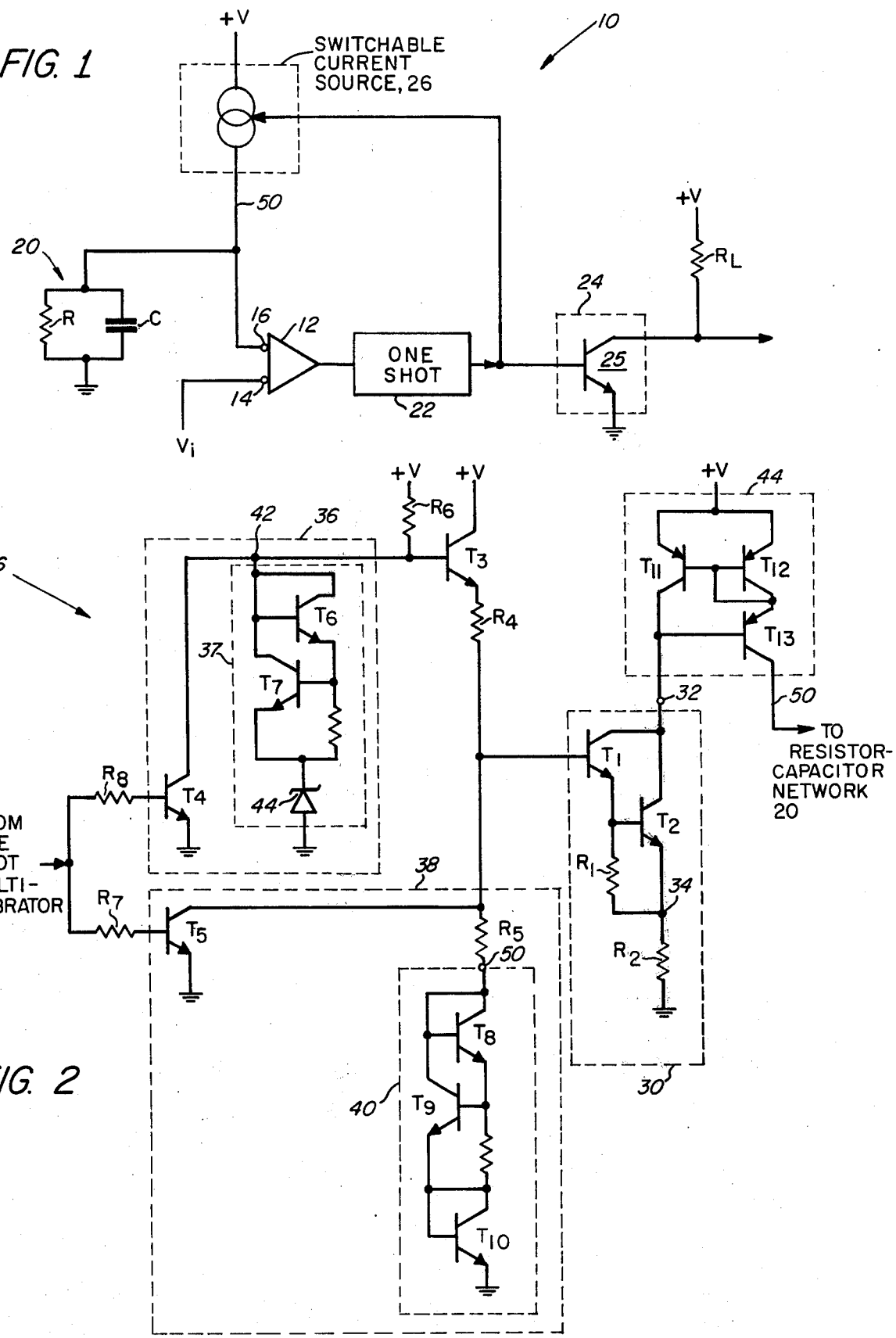

TEMPERATURE COMPENSATED CURRENT SOURCE

BACKGROUND OF THE INVENTION

This invention relates generally to voltage-to-frequency converters and more particularly to temperature compensated, switchable current sources used in such converters.

As is known in the art, voltge-to-frequency converters have been used for many years in a wide variety of applications. One type of voltage-to-frequency converter produces a series of pulses of fixed width and height at a rate proportional to the level of an input voltage. In such converter the input voltage is passed through a resistor-capacitor integrator to one input of a voltage comparator. The output of the voltage comparator is coupled to a one shot multivibrator, the output of which is fed back to the first mentioned input of the voltage comparator. The voltage at the output of the integrator increases, in response to the input voltage, at a rate proportional to the level of the input voltage. As soon as the integrator output exceeds a fixed, predetermined voltage level which is established by a voltage source coupled to the other input of the voltage comparator, the voltage comparator triggers the one shot multivibrator, the latter thereby producing a pulse of fixed time duration. In the ideal case this pulse instantaneously resets the voltage stored in the capacitor of the integrator to zero volts. The process continues and it follows that the rate at which the pulses are produced by the one shot multivibrator will be, to an approximation, proportional to the charge rate of the capacitor and therefore, to an approximation, to the level of the input voltage.

While the voltage-to-frequency converter described above may be adequate in some applications, such converter has been modified for other applications to include the use of a charge dispensing technique to improve the linearity of the converter. With such technique the charge stored in a "timing" capacitor is quickly dumped into a large discharge capacitor. The charge is generally supplied from a switchable current source. In order for such converter to find wide application, it is generally required that such current source operate over a wide range of temperature without appreciable variation in the amount of current supplied to the capacitor. Also, where a switching arrangement is used, it is generally necessary that the action of such switching arrangement be quick and precise in order to insure accurate voltage-to-frequency conversion.

SUMMARY OF THE INVENTION

With this background of the invention in mind, it is an object of this invention to provide an improved switchable current source for use in a voltage-to-frequency converter.

It is another object of this invention to provide an improved switchable current source for use in a voltage-to-frequency converter, such current source being adapted to operate accurately over a wide range of temperatures.

It is another object of this invention to provide an improved voltage-to-frequency converter having a switchable current source adapted to operate over a wide range of temperatures.

It is still a further object of this invention to provide an improved temperature compensated current source adapted to be switched quickly and precisely.

These and other objects of the invention are attained generally by providing, for use in a voltage-to-frequency converter, a temperature compensated switchable current source, comprisng: An emitter-follower circuit adapted to provide, at a terminal, a reference voltage for the current source when such current source is in a conducting state, such circuit including at least one transistor having a base electrode coupled to a source of switching signals through two electrical paths and an emitter electrode coupled to such terminal, the reference voltage varying with temperature over a range of temperatures as the base-to-emitter voltage of such transistor varies with such temperature and wherein each one of such electrical paths has disposed therein a pair of switching transistors and diode means for producing a voltage at the base electrode of the first mentioned transistor which varies in temperature over the range of temperatures inversely to the reference voltage variation to maintain the voltage at the terminal substantially constant over the range of temperatures.

With such arrangement, in addition to providing a substantially temperature invariant reference voltage for the current source, the emitter-follower circuit, and hence the current source, may be rapidly switched from the conducting state to a nonconducting state because the base electrode of the transistor included in such circuit is driven to such nonconducting state through two electrical paths.

BRIEF DESCRIPTION OF THE DRAWINGS

The foregoing features of this invention, as well as the invention itself, may be more fully understood from the following detailed description read together with the accompanying drawings, in which:

FIG. 1 is a block diagram of a voltage-to-frequency converter, such converter including a switchable current source according to the invention; and FIG. 2 is a schematic diagram of the switchable current source used in the voltage-to-frequency converter shown in FIG. 1.

DESCRIPTION OF THE PREFERRED EMBODIMENT

Referring now to FIG. 1, a voltage-to-frequency converter 10 is shown to include a voltage comparator 12 having one input terminal 14 coupled to an input voltage ($V_i$) source (not shown) and a second input terminal 16 coupled to a resistor-capacitor network 20 and to a switchable current source 26, as shown. In particular, a resistor R and a capacitor C in such network 20 are connected together in a shunt arrangement. The resistor R and the capacitor C each have one electrode coupled to ground and another electrode connected, inter alia, to input terminal 16. The output of voltage comparator 12 is connected to the input of a one shot multivibrator 22. One shot multivibrator 22 is here of any conventional design and, in response to a trigger signal from voltage comparator 12, as when the voltage at terminal 16 is greater than or equal to the voltage at terminal 14, such one shot multivibrator produces a "low" signal for a fixed, predetermined time duration, T.

The output of the one shot multivibrator 22 is fed:

1. to a conventional logic output circuit 24, here a grounded emitter transistor 25, the base electrode thereof being coupled to the output of the one shot multivibrator 22 and the collector electrode being coupled to a +V voltage source through a load resistor $R_L$; and, 2. to the switchable current source 26, the details of which will be discussed in connection with FIG. 2. Suffice it to say here, however, that when the output of the one shot multivibrator 22 is "low" the switchable current source 26 is switched to a conducting state (i.e. "on") and current flows from the +V voltage source through the switchable current source 26 to the resistor-capacitor network 20 to charge capacitor C, and conversely, when the output of such one shot multivibrator 22 is "high" the switchable current source 26 is in a nonconducting state (i.e. "off") and the current flow to the resistor-capacitor network 20 is shut off. It should also be noted that when the output of one shot multivibrator 22 is "low" transistor 25 is "off" and when the voltage of the collector electrode thereof is "high" transistor 25 is "on" and the voltage at the collector electrode thereof is "low."

In operation, the voltage comparator 12 compares a positive input voltage, $V_i$, applied to terminal 14 with the voltge $V_B$ at terminal 16. If the input voltage $V_i$ is equal to, or greater than, the voltage $V_B$ the voltage comparator 12 produces a trigger signal at its output which activates the one shot multivibrator 22. Once activated the one shot multivibrator 22 produces a "low" signal at its output for the predetermined time period, T, and (1) the switchable current source 26 will switch to its conducting state to supply a current level, I, to the resistor-capacitor network 20 for the time period T; and (2) the output of logic output circuit 24 will produce a "high" pulse of time duration T. At the end of the predetermined time period, T, the switchable current source 26 will have injected an amount of charge $Q = IT$ into the resistor-capacitor network 20, such charge, Q, being stored in the capacitor C. The voltage, $V_B$, at terminal 16 is then $V_B = QC$. If the charge Q is not sufficient to increase the voltage $V_B$ such that $V_B$ is greater than or equal to the voltage $V_i$, the voltage comparator 12 will again activate the one shot multivibrator 22 and the switchable current source 26 will inject another lump of charge into the resistor-capacitor circuit 20. This process continues until the switchable current source 26 injects sufficient charge into the resistor-capacitor circuit 20 so that the charge stored by capacitor C produces a voltage $V_B$ which is equal to (or greater than) the voltage $V_i$. When this condition is achieved, the switchable current source 26 remains in its nonconducting state and the voltage $V_B$ decays until it again is slightly less than the voltage $V_i$. This completes one cycle of operation and the voltage-to-frequency converter 10 will then be in a steady state condition. In such steady state condition the switchable current source 26 will dump lumps of charge into the resistor-capacitor circuit 20 at a rate fast enough to keep the voltage $V_B$ substantially equal to the voltage $V_i$. The frequency at which the one shot multivibrator 22 is actuated, and hence the rate at which pulses are produced at the output of logic output circuit 24, will be, in the steady state condition, proportional to $V_B/R$, and since, in the steady state condition, $V_B$ is kept substantially equal to $V_i$, the frequency of the pulses produced at the output of the logic output circuit 24 (i.e. the output of the converter 10) will also be proportional to the level of the input voltage $V_i$.

Referring now to FIG. 2, the switchable current source 26 suitable for monolithic integrated circuit fabrication is shown. Such switchable current source 26 includes an emitter-follower circuit 30 having a pair of transistors $T_1$, $T_2$ arranged as a Darlington pair. In particular, the collector electrodes of transistor $T_1$, $T_2$ are connected together at a common terminal 32. The emitter electrode of transistor $T_1$ is connected to the base electrode of transistor $T_2$ and to the emitter electrode of transistor $T_2$ through a resistor $R_1$ and the emitter electrode of transistor $T_2$ is connected to ground through a resistor $R_2$, the resistor $R_2$ and the emitter electrode of transistor $T_2$ being connected together at a terminal 34.

The base electrode of transistor $T_1$ is connected to the output of one shot multivibrator 22 (FIG. 1) through two electrical paths. One of such electrical paths has disposed therein a resistor $R_4$, a transistor $T_3$ and a network 36, such network 36 having a switching transistor $T_4$ and a diode means 37 connected in shunt therewith, as shown. The other one of such electrical paths has disposed therein a network 38, such network 38 having a switching transistor $T_5$, and, connected in shunt therewith, a resistor $R_5$ and serially connected diode means 40. In particular, transistor $T_3$ has its emitter electrode connected to the base electrode of transistor $T_1$ through resistor $R_4$, its collector electrode connected to the +V voltage source and its base electrode connected to the output of network 36 and also to the +V voltage source through a resistor $R_6$, as shown. In network 36 diode means 37 has two transistors, $T_6$, $T_7$, each connected to form diodes, such diodes being serially connected between terminal 42 and ground through a Zener diode 44, as shown. The transistor $T_4$ has its base electrode connected to the output of one shot multivibrator 22 (FIG. 1) through a resistor $R_8$, its emitter electrode connected to ground, and its collector electrode connected to terminal 42.

Referring to network 38, diode means 40 includes three transistors $T_8$, $T_9$, $T_{10}$ connected to form three diodes, such diodes being serially connected between ground and the base electrode of transistor $T_1$ through resistor $R_5$, as shown. Transistor $T_5$ has its base electrode connected to the one shot multivibrator 22 (FIG. 1) through resistor $R_7$, its emitter electrode connected to ground and its collector electrode connected to the base electrode of transistor $T_1$, as shown.

In operation, when the output of one shot multivibrator 22 (FIG. 1) is "low" transistors $T_4$ and $T_5$ are driven to an "off" condition. The Zener diode 44 and diodes formed by transistors $T_6$ and $T_7$ thereby cause terminal 42 to be clamped at +6.8 volts and therefore transistor $T_3$ is forward-biased. Current passes through transistor $T_3$ and through resistor $R_5$ and the diodes formed by transistors $T_8$, $T_9$ and $T_{10}$ to forward bias the transistors $T_1$, $T_2$ in the emitter-follower circuit 30. In such condition a reference voltage $V_R$ is produced at terminal 34. With such reference voltage $V_R$ produced at terminal 34 the current flow through resistor $R_2$ is $R_R/R_2$. Because of the high beta of transistors $T_1$, $T_2$ the amount of base current to transistor $T_1$ is negligible. Therefore, the current $V_R/R_2$ is supplied via the +V voltage supply through a "current mirror" or Wilson "current source" 44. The Wilson current source is described in an article entitled "A Monolithic Junction FET—n-p-n Operational Amplifier" by George R. Wilson, publication in Journal of Solid-State Circuits, Vol. SC-3, No. 4, December 1968. Such Wilson "current source" here includes three transistors $T_{11}$, $T_{12}$ and $T_{13}$, all being "matched" high beta transistors. The emitter electrodes of transistors $T_{11}$ and $T_{12}$ are connected to the $+V$ voltage source and the base electrodes of such transistors are connected together and are also connected to the collector electrode of transistor $T_{12}$. The transistor $T_{13}$ has its emitter electrode connected to the collector electrode of transistor $T_{12}$, its base electrode connected to the collector electrode of transistor $T_{11}$ and to the collector electrodes of transistors $T_1$, $T_2$ and its collector electrode provides the output for the switchable current source 26. Such output is connected to the resistor-capacitor network 20 (FIG. 1) via line 50. Because of the high beta of transistors $T_{11}$, $T_{12}$, $T_{13}$ the current flow through the collector electrode of transistor $T_{13}$ will be proportional to, here approximately equal to, the current flow through the resistor $R_2$ and hence in order to provide a satisfactory stable source of current over a wide range of temperatures it is necessary that the reference voltage $V_R$ be maintained substantially constant over such range of temperature.

Because of the temperature effect on transistors, the base-to-emitter voltage of a conducting transistor varies in the order of 2mV/° C over a range of temperatures in the order of $-55°$ C to 125° C. While the base-to-emitter voltage variation of transistors $T_1$, $T_2$ is $+4$mV/° C, in the switchable current source 26 a $-4$mV/° C variation is produced on the base electrode of transistor $T_1$ in a manner to be described to cancel the temperature effects of transistors $T_1$, $T_2$ on the reference voltage $V_R$ and thereby maintain such reference voltage substantially constant (i.e. at the voltage $V_R$) over the range of temperatures.

Referring first to the diode means 40, a $-2$mV/° C variation exists at the base electrode of transistor $T_{10}$, a $-4$mV/° C variation exists at the base electrode of transistor $T_9$ and a $-6$mV/° C variation exists at the base electrode of transistor $T_8$ (and hence at terminal 50).

Referring now to the diode means 37, Zener diode 44 is here designed so that temperature variation at the emitter electrode of transistor $T_7$ is $+1$mV/° C. Therefore, the variation at the base electrode of transistor $T_7$ is $-1$mV/° C and the variation at the base electrode of transistor $T_6$, and hence at the base electrode of transistor $T_3$, is $-3$mV/° C. The variation of the emitter electrode of transistor $T_3$ is therefore $-1$mV/° C. It follows then that the voltage variation across resistors $R_4$, $R_5$ is $-5$mV/° C. The resistors $R_4$, $R_5$ divide this variation so that the variation at the base electrode of transistor $T_1$ is:

$$-6\text{mV/° C} + 5\text{mV/° C} [R_5/(R_4+R_5)]$$

The values of resistors $R_4$ and $R_5$ are selected so that the variation of the base electrode of transistor $T_1$ is $-4$mV/° C, for reasons discussed above. Typically resistor $R_4$ is 10K ohms and resistor $R_5$ is 5K ohms, thereby here producing a $-4.7$mV/° C variation on the base electrode of transistor $T_1$ and hence a substantially temperature invariant reference voltage $V_R$.

Referring again to FIG. 2 and considering the operation of the switchable current source 26 when responding to a "high" signal at the output of one shot multivibrator 22 (FIG. 1), when such output switches "high," transistors $T_4$ and $T_5$ turn "on" and couple the collector electrodes thereof to ground. Therefore, the base electrode of transistor $T_1$ is coupled to ground through transistor $T_5$ rapidly switching the current source 26 to a nonconducting state. It is noted that although transistor $T_3$ will be driven to a nonconducting state because transistor $T_4$ is "on," thereby preventing base current to flow to transistor $T_1$, the switching of transistor $T_5$ to an "on" state drives the current source 26 to the nonconducting state quickly and precisely, thereby insuring proper, reliable and accurate operation of the switchable current source 26 and of the frequency converter 10 (FIG. 1).

Having described a preferred embodiment of the invention, numerous variations will now become readily apparent to one of skill in the art. It is felt, therefore, that the invention should not be limited to the particular embodiment here shown, but rather should be limited only by the spirit and scope of the appended claims.

What is claimed is:

1. A temperature compensated switching circuit, comprising:
    a. an emitter-follower circuit including a pair of transistors arranged in a Darlington configuration, a first one of such pair of transistors having a base electrode adapted for coupling to a source of switching signals through two electrical paths and an emitter electrode connected to the base electrode of a second one of such pair of transistors, and a resistor connected between the emitter electrode of the second one of the pair of transistors and ground;
    b. a pair of input transistors disposed in corresponding ones of such paths, each one of such transistors being arranged in a grounded emitter configuration having base electrodes adapted for coupling to the source of switching signals and collector electrodes coupled to the base electrode of the first one of the pair of transistors in the Darlington configuration; and
    c. means, including a pair of diode networks coupled to the collector electrodes of the pair of input transistors, for producing a voltage variation at the base electrode of the first one of the pair of transistors in the Darlington configuration which varies inversely to the temperature variation developed across the base-emitter junctions of the pair of transistors arranged in the Darlington configuration.

2. The circuit recited in claim 1 wherein each one of the diode networks includes a plurality of serially coupled diode means.

3. The circuit recited in claim 2 wherein one of such diode networks includes a Zener diode.

4. The circuit recited in claim 1 including a voltage divider network having an output coupled to the base electrode of the one of the transistors in the Darlington pair and wherein one of such diode networks is coupled to a first input terminal of such voltage divider network and the other one of such diode networks is coupled to a second input of such voltage divider network.

5. The circuit recited in claim 4 wherein each one of such diode networks includes a plurality of serially coupled diode means.

6. The circuit recited in claim 5 wherein one of such diode networks includes a Zener diode.

7. The circuit recited in claim 6 including a coupling transistor having its base-emitter junction disposed between one of the diode networks and one of the inputs to the voltage divider network.

8. A temperature compensated, switchable current source, comprising: an emitter-follower circuit adapted to provide, at a terminal, a reference voltage for such current source when such current source is in a conducting state, such circuit including a first transistor having a base electrode adapted for coupling to a source of switching signals through two electrical paths and an emitter electrode coupled to such terminal through a second transistor in such emitter-follower circuit and a resistor connected to ground and to the emitter electrode of the second transistor at such terminal, the reference voltage varying with temperature over a range of temperatures as the base-to-emitter voltages of such transistors vary with such temperature and wherein each one of such electrical paths has disposed therein a pair of switching transistors arranged in a grounded emitter configuration having base electrodes adapted for coupling to the source of switching signals and collector electrodes coupled to the base electrode of the first transistor in the emitter-follower circuit; and means, including a pair of diode networks coupled to the collector electrodes of the pair of switching transistors, for producing a voltage at the base electrode of the first transistor in the emitter-follower circuit which varies in temperature over the range of temperatures maintaining the voltage at the terminal substantially constant over the temperature range.

9. A switching circuit, comprising:
  a. an emitter follower circuit having:
    i. a resistor; and
    ii. a pair of output transistors, a first one thereof having a base electrode and a second one of such pair of transistors having:
      A. a base electrode connected to an emitter electrode of the first one of the pair of output transistors;
      B. a collector electrode connected to the collector electrode of the first one of the pair of output transistors; and
      C. an emitter electrode coupled to ground through said resistor;
  b. a pair of input transistors having base electrodes coupled to a source of switching signals and grounded emitter electrodes, a first one of the pair of input transistors having a collector electrode connected to the base electrode of the first one of the pair of output transistors;
  c. a coupling transistor having a base electrode connected to a collector electrode of a second one of the pair of input transistors and an emitter electrode coupled to the base electrode of the first one of the pair of output transistors; and
  d. a pair of diode networks coupled between ground and the collector electrodes of corresponding ones of the pair of input transistors.

10. The circuit recited in claim 9 wherein one of the diode networks includes a Zener diode.

11. The circuit recited in claim 10 including a second resistor connected between the emitter electrode of the coupling transistor and the base electrode of the first one of the pair of output transistors.

12. The circuit recited in claim 11 including a third resistor having one terminal connected to both the collector electrode of the first one of the pair of input transistors and the base electrode of the first one of the pair of output transistors; and a second terminal connected to one of the diode networks.

13. A temperature compensated switching circuit, comprising:
  a. an emitter-follower circuit comprising a pair of transistors arranged in a Darlington configuration;
  b. means for switching such pair of transistors to either a conducting state or a nonconducting state selectively in accordance with a control signal producing a reference voltage at an emitter electrode of a first one of the pair transistors in the Darlington configuration when such transistor is in a conducting state, such means including a pair of input transistors arranged in a grounded emitter configuration having base electrodes adapted for coupling to a source of the switching signals and collector electrodes coupled to a base electrode of a second one of the pair of transistors in the Darlington configuration; and
  c. means, including a pair of diode networks coupled between ground and corresponding ones of the pair of collector electrodes of the pair of input transistors, for maintaining the reference voltage substantially invariant with temperature variations over a predetermined range of temperatures.

14. The circuit recited in claim 13 wherein the maintaining means includes a coupling transistor having: an emitter electrode coupled to the base electrode of the second one of the transistors in the emitter-follower circuit, and a base electrode connected to the collector electrode of a first one of the pair of input transistors.

15. The circuit recited in claim 14 including: a first resistor connected between the emitter electrode of the coupling transistor and the base electrode of the second one of the transistors in the emitter-follower circuit; and a second resistor connected between the collector electrode of the second one of the pair of input transistors and a first one of the diode networks, such collector electrode being connected to the base electrode of the second one of the transistors in the emitter-follower circuit.

16. The circuit recited in claim 15 wherein a second one of the diode networks includes a Zener diode.

17. The circuit recited in claim 12 wherein the pair of diode networks is grounded.

18. The circuit recited in claim 17 including means for coupling the collector electrode of the coupling transistor and the collector electrodes of the pair of output transistors to a voltage source.

19. The circuit recited in claim 18 including a current mirror circuit adapted for coupling between the voltage source and the pair of output transistors.

20. The circuit recited in claim 17 including means for coupling an emitter electrode of the first one of the pair of output transistors to ground through a third resistor.

21. A switching circuit, comprising:
  a. an emitter-follower circuit having a pair of output transistors, a first one thereof having a base and a second one of such pair of output transistors having:
    i. a base connected to an emitter of the first one of the pair of output transistors; and
    ii. a collector connected to the collector of the first one of the pair of output transistors;
  b. a pair of input transistors having bases coupled to a source of switching signals, a first one of the pair of input transistors having a collector connected to the base of the first one of the pair of output transistors;
  c. a junction semiconductor device having one terminal connected to a collector of a second one of the pair of input transistors and a second terminal coupled to the base of the first one of the pair of output transistors; and d. a pair of diode networks coupled to the collectors of corresponding ones of the pair of input transistors.

22. The circuit recited in claim 21 including additionally:

a. a first resistor connected between the semiconductor device and the base of the first one of the pair of output transistors; and b. a second resistor having: one terminal connected to the collector of the first one of the pair of input transistors and the base of the first one of the pair of output transistors; and a second terminal connected to a first one of the diode networks.

23. The circuit recited in claim 22 wherein the pair of input transistors has grounded emitters.

24. The circuit recited in claim 23 wherein the semiconductor device includes a transistor, and the junction thereof is the base-emitter junction of such transistor.

* * * * *